United States Patent
Cheng et al.

(10) Patent No.: US 11,895,934 B2
(45) Date of Patent: Feb. 6, 2024

(54) PHASE CHANGE MEMORY WITH HEATER

(71) Applicant: International Business Machines Corporation, Armonk, NY (US)

(72) Inventors: Kangguo Cheng, Schenectady, NY (US); Chanro Park, Clifton Park, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 17/412,157

(22) Filed: Aug. 25, 2021

(65) Prior Publication Data
US 2023/0074555 A1    Mar. 9, 2023

(51) Int. Cl.
*H10N 70/00* (2023.01)
*H10N 70/20* (2023.01)

(52) U.S. Cl.
CPC ....... *H10N 70/8613* (2023.02); *H10N 70/021* (2023.02); *H10N 70/046* (2023.02); *H10N 70/231* (2023.02); *H10N 70/826* (2023.02); *H10N 70/8828* (2023.02)

(58) Field of Classification Search
CPC ............. H10N 70/8613; H10N 70/021; H10N 70/046; H10N 70/231; H10N 70/826; H10N 70/8828; H10N 70/011; H10N 70/8413; H10B 63/10; H10B 63/80
See application file for complete search history.

(56) References Cited

U.S. PATENT DOCUMENTS

| | | | |
|---|---|---|---|
| 6,894,305 B2 | 5/2005 | Yi | |
| 8,586,961 B2 | 11/2013 | Pop | |
| 8,988,926 B2 | 3/2015 | Pellizzer | |
| 9,412,442 B2 | 8/2016 | Pop | |
| 9,548,110 B2 | 1/2017 | Athmanathan | |
| 2009/0321706 A1* | 12/2009 | Happ | H10N 70/245 438/102 |
| 2013/0099189 A1* | 4/2013 | Sandhu | H10N 70/245 438/381 |
| 2015/0263277 A1* | 9/2015 | Ozawa | H10N 70/8416 257/5 |
| 2021/0249593 A1* | 8/2021 | Lai | H10N 70/8833 |

FOREIGN PATENT DOCUMENTS

WO        2008129477 A2    10/2008

OTHER PUBLICATIONS

Hashemi et al., "Self-Correcting Process for High Quality Patterning by Atomic Layer Deposition", Publication Date: Jul. 16, 2015, ACS Nano 2015, 9, 9, 8710-8717.

(Continued)

*Primary Examiner* — Jerome Leboeuf
(74) *Attorney, Agent, or Firm* — David K. Mattheis

(57) ABSTRACT

A phase change memory (PCM) structure including a bottom electrode, a first dielectric spacer disposed above and in contact with the bottom electrode, the first dielectric spacer comprising a vertical seam, a PCM layer disposed above the first dielectric spacer, and a heater element disposed in the seam and in contact with the bottom electrode.

9 Claims, 12 Drawing Sheets

(56) References Cited

OTHER PUBLICATIONS

Neumann et al., "Engineering thermal and electrical interface properties of phase change memory with monolayer MoS2", Appl. Phys. Lett. 114, 082103 (2019); doi: 10.1063/1.5080959 Submitted: Nov. 12, 2018 . Accepted: Feb. 7, 2019 . Published Online: Feb. 27, 2019, 8 pps.
Seo et al., "Reaction Mechanism of Area-Selective Atomic Layer Deposition for Al2O3 Nanopatterns", ACS Appl. Mater. Interfaces 2017, 9, 47, 41607-41617, Publication Date: Nov. 7, 2017.
Wong et al., "Phase Change Memory", vol. 98, No. 12, Dec. 2010, 27 pps., <https://nanoheat.stanford.edu/sites/default/files/publications/A126.pdf>.

* cited by examiner

PHASE CHANGE MEMORY WITH HEATER

FIELD OF THE INVENTION

The disclosure relates generally to phase change memory structures. The disclosure relates particularly to phase change memory structures incorporating a phase change material heater.

BACKGROUND

Phase Change Memory (PCM) devices are non-volatile memory devices in which the state of the memory elements can be retained for days to decades without power consumption. Examples of volatile memory devices include Dynamic Random-Access Memory (DRAM) and Static Random-Access Memory (SRAM); where DRAM requires the memory element to be constantly refreshed while SRAM requires a constant supply of energy to maintain the state of the memory element.

With phase change memory, information is stored in materials that can be manipulated into different phases. Each of these phases exhibit different electrical properties which can be used for storing information. The amorphous and crystalline phases are typically two phases used for bit storage (0's and 1's) since they have detectable differences in electrical resistance. Specifically, the amorphous phase has a higher resistance than the crystalline phase.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a method for fabricating a phase change memory (PCM) structure, includes: forming a bottom electrode upon a substrate, forming a first dielectric spacer upon the bottom electrode, the dielectric spacer comprising a via exposing a portion of the bottom electrode, forming a second dielectric spacer within the via, the second dielectric spacer comprising a vertical seam, forming a heater element within the seam, and forming a PCM layer above the heater element.

In one aspect, A phase change memory (PCM) structure including a bottom electrode, a first dielectric spacer disposed above and in contact with the bottom electrode, the first dielectric spacer comprising a vertical seam, a PCM layer disposed above the first dielectric spacer, and a heater element disposed in the seam and in contact with the bottom electrode.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
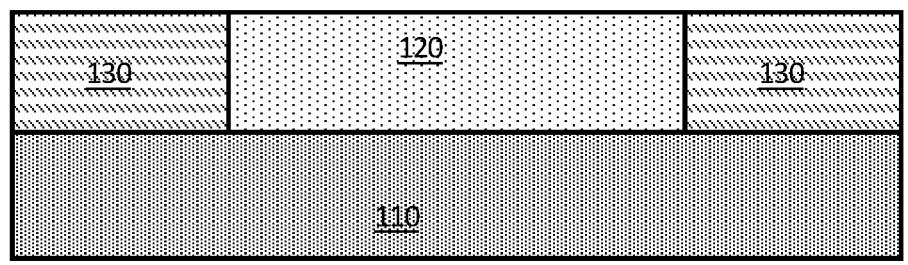
FIG. 1 provides a cross-sectional view of a step in the fabrication of a semiconductor device, according to an embodiment of the invention. The figure illustrates the device after the formation of a PCM bottom electrode formed upon a substrate.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

PCM material takes advantage of the large resistance contrast between the amorphous and crystalline states. The amorphous phase has high electrical resistivity, and the crystalline phase has a low resistivity. Oftentimes the difference in resistivity is three to four orders of magnitude. Thus, the change in read current is very large which provides for an opportunity for multiple analog levels that are needed for multi-level cell technology operations.

From a high resistivity amorphous phase, the PCM material may be set to the low resistivity crystalline phase by the application of sufficient current to raise the temperature of the PCM material above the threshold temperature necessary to crystalize the amorphous phase. The PCM material may then be reset by the application of sufficient current to raise the temperature of the PCM material above the melt temperature of the material, melting the crystals. The molten material is then quenched by the rapid removal of the current. Quenching the PCM material results in the material returning to the amorphous glass phase.

Phase change memory devices offer a means to support analog computing devices as each memory cell has the capacity to store a range of values rather than a simple binary "1" or "0". The stored value of each cell corresponds to the resistance of the phase change material of the cell. The resistance varies according to the relative proportions of crystalline and amorphous structures of the material. Such proportions may be altered by applying heat to the material by way of electrical currents. PCM cells are formed with the material in a crystalline state. Application of a short duration high voltage and current electrical pulse raises the temperature of at least a portion of the material beyond the melt temperature. This breaks down the crystalline structure of the material. The short duration of the pulse results in a rapid temperature drop, quenching the melted portion of the material and leaving it in an amorphous state as there is insufficient time for the crystal lattice to form. Application of a lower level of voltage (the set voltage) over a longer duration causes the temperature of portions of the of the amorphous material exceed a crystallization temperature threshold, causing those portions to crystalize, lower the resistance of the combined states of the material. Reading the value of the cell includes application of a voltage below the set voltage and reading the associated current through the cell.

Conventional PCM designs result in a mushroom of amorphous material above the heating element and below the crystalline portion of the PCM material. This mushroom design requires a relatively high current to reset the device. Reset current has been found to be directly proportional to heater element contact area. Reducing the heater element contact area reduces the magnitude of the current required to reset the device. Reducing the current reduces device energy consumption and device temperatures which may degrade device operations over time and billions of set-reset cycles. Disclosed embodiments provide PCM structure having reduced heating elements to enable reset current reductions. Disclosed embodiments further increase device uniformity and reduce cell-to-cell variability of PCM devices by providing arrays of devices with each PCM cell having a substantially similar heating filament.

Reference is now made to the figures. The figures provide schematic cross-sectional illustration of semiconductor devices at intermediate stages of fabrication, according to one or more embodiments of the invention. The figures provide a cross-section view of devices at various stages of fabrication. The figures provide schematic representations of the devices of the invention and are not to be considered accurate or limiting with regards to device element scale.

FIG. 1 illustrates device 100 following the formation of bottom electrode 120 upon underlying device substrate 110. Substrate 110 may include contact regions for underlying control elements including transistors.

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Although not shown, the substrate 110 can include other devices and structures such as transistors, resistors, capacitors, diodes, contacts, isolations, etc.

As shown in the Figure, a layer of dielectric material 130, such as silicon oxide, carbon-doped silicon oxide, fluorine-doped silicon oxide, porous dielectric material, silicon nitride, etc., is disposed upon substrate 110. A via is etched though the dielectric 130, and bottom electrode material, such as tungsten or copper, is deposited in the via in contact with the underlying substrate 110. Chemical mechanical planarization (CMP) of the upper surfaces of the dielectric 130 and bottom electrode follow their formation.

Figure 2:
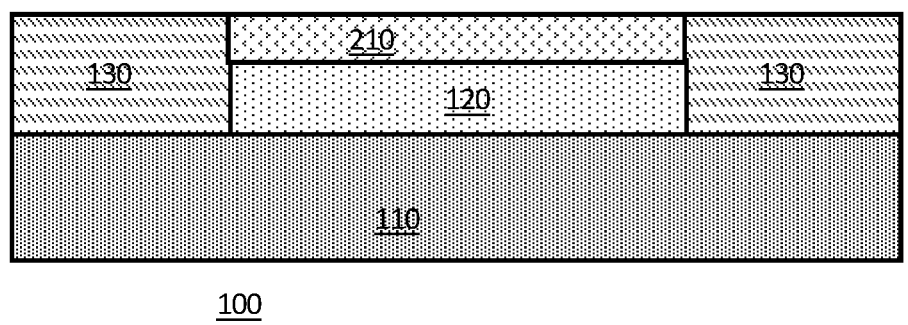
FIG. 2 provides a cross-sectional view of a step in the fabrication of a semiconductor device, according to an embodiment of the invention. The figure illustrates the device after formation of an optional lower filament element reservoir formed as part of the bottom electrode.

FIG. 2 illustrates an embodiment of device 100 wherein the overall bottom electrode includes a lower portion comprising a first material 120, such as tungsten, and an upper portion 210 comprising a heating filament reservoir such as copper or silver, or similar material. In this embodiment, the heater element reservoir provides material for diffusion along a dielectric spacer seam for forming the device heater filament.

Figure 3:
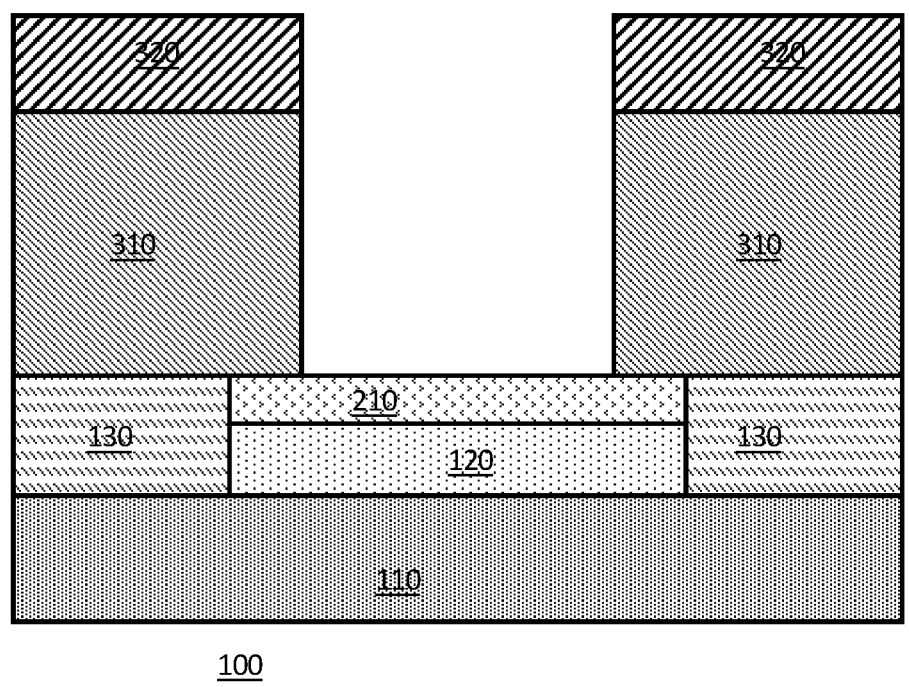
FIG. 3 provides a cross-sectional view of a step in the fabrication of a semiconductor device, according to an embodiment of the invention. The figure illustrates the device after formation of a dielectric spacer and heater filament via.

FIG. 3 illustrates device 100 following the formation of a via for the formation of the heater filament. As shown in the Figure, two layers of material, a first dielectric spacer material 310, such as silicon nitride and an optional protective hardmask metallic layer 320, such as titanium nitride, are disposed above the dielectric layer 130 and the bottom electrode combination 120, 210, as described above. Masking, patterning, and selective etching, such as reactive io etching, yield the heater element via. Such vias may have circular, elliptical, square, or rectangular cross sections. Production of the vias may yield openings in a range of sizes. In an embodiment, the vias comprise circular openings having nominal diameters of about 40 nanometers.

Figure 4:
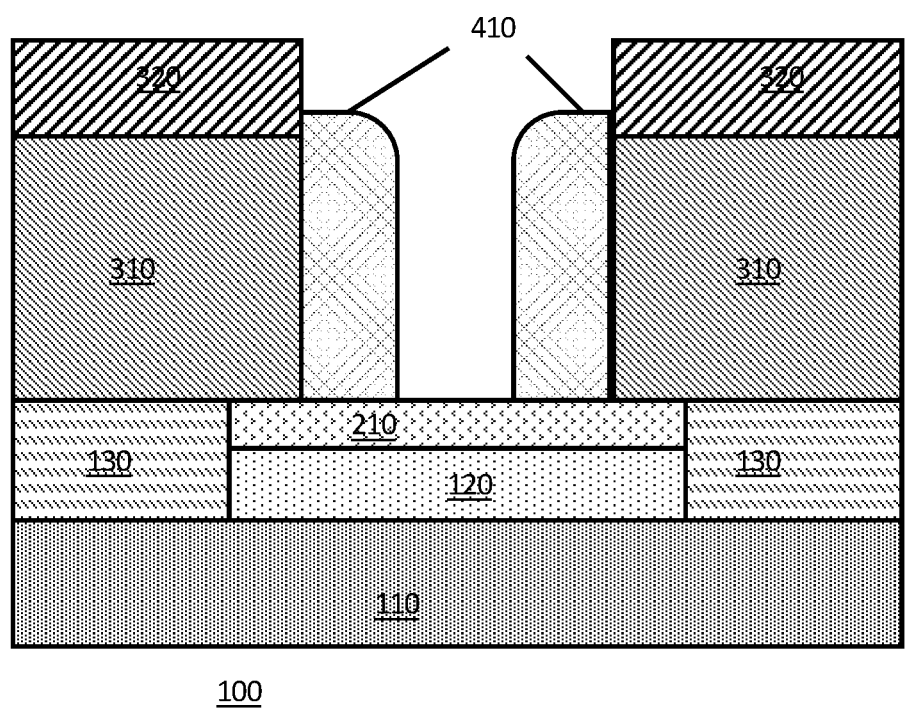
FIG. 4 provides a cross-sectional view of a step in the fabrication of a semiconductor device, according to an embodiment of the invention. The figure illustrates the device after the formation of an optional dielectric spacer within the filament element via.

FIG. 4 illustrates device 100 following the formation of an optional intermediate second dielectric spacer 410 surrounded by first dielectric spacer 310, within the heater element via. The second dielectric spacer 410 can be formed by depositing a dielectric material, such as silicon nitride, within the via followed by a directional etch, such as reactive ion etch (RIE). The second dielectric spacer 410 reduces the diameter of the openings exposing the upper surfaces of the bottom electrodes, to about 15 nanometers and lower the upper surface of the intermediate second dielectric spacer 410.

Figure 5:
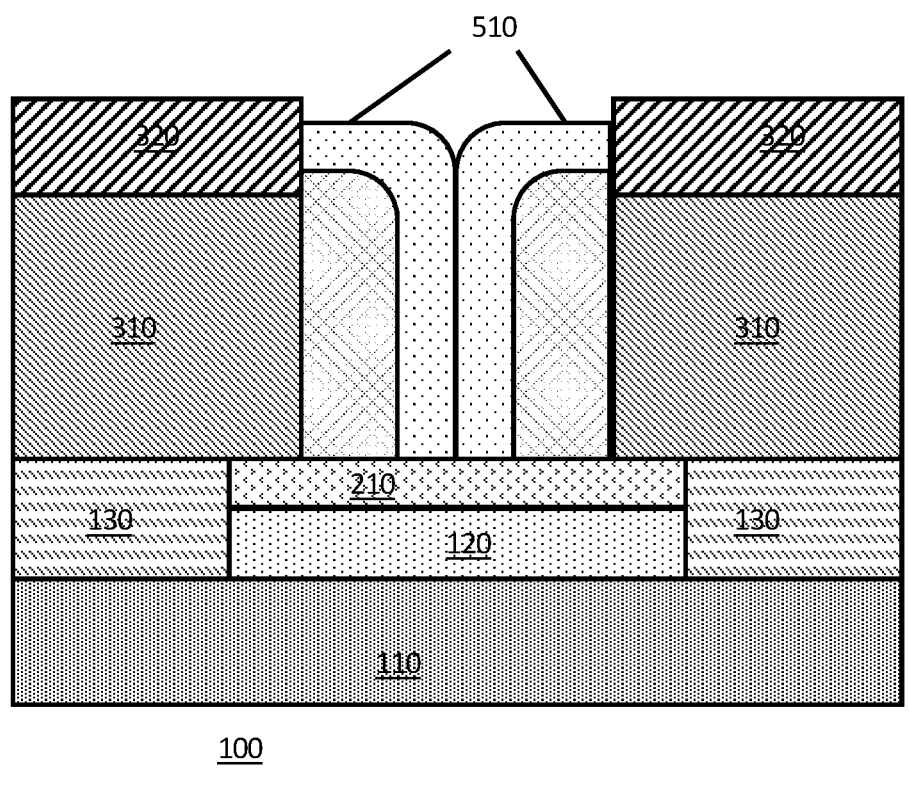
FIG. 5 provides a cross-sectional view of a step in the fabrication of a semiconductor device, according to an embodiment of the invention. The figure illustrates the device after the formation of a seamed dielectric spacer.

FIG. 5 illustrates device 100 following deposition of inner third dielectric spacer 510 surrounded by second dielectric spacer 410, using selective deposition methods such as atomic layer deposition (ALD), within the remaining heater element via. Prior to the material deposition, a precleaning step may be performed to remove any oxide formed upon the upper surface of the bottom electrode. Through the selective ALD process, the spacer material, such as $Al_2O_3$, nucleates and grows only on the surfaces of the intermediate second dielectric spacers 410 and not on the upper surface of the conductive bottom electrode. This formation pattern results in the dielectric material pinching off the via at a seam extending from the upper surface of the bottom electrode to the upper surface of the third dielectric spacer material 510.

Figure 6:
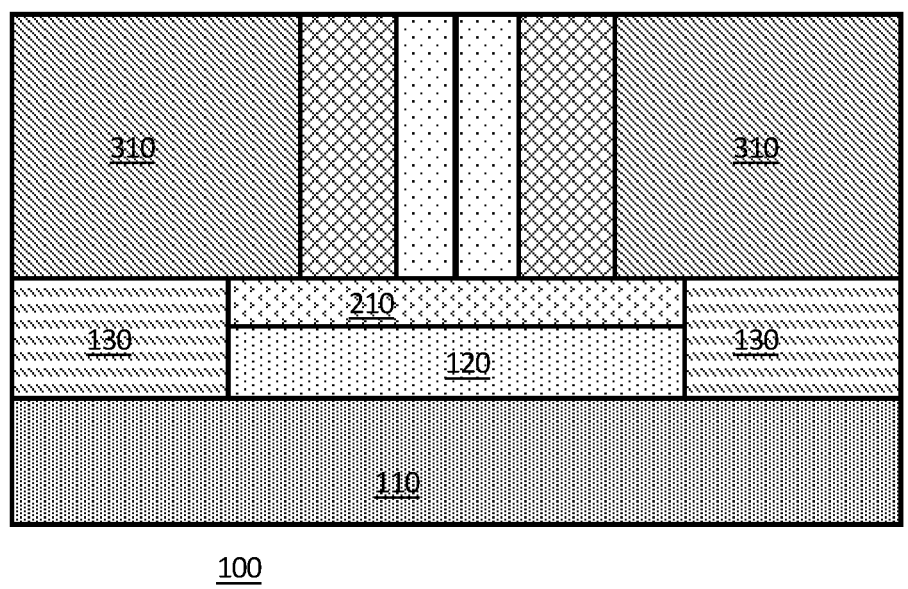
FIG. 6 provides a cross-sectional view of a step in the fabrication of a semiconductor device, according to an embodiment of the invention. The figure illustrates the device after planarization prior to filament formation.

FIG. 6 illustrates device 100 following removal of protective mask 320 and planarization of the structure. In an embodiment, hardmask 320 is etched away and a sacrificial layer (not shown), such as silicon oxide is deposited above the remaining structure. The sacrificial silicon oxide layer is then polished using CMP processes to the upper surface of the first dielectric spacer layer 310, providing a co-planar upper surface for dielectric spacers 310, 410, and 510, and exposing an upper portion of the seam of third dielectric spacer 510.

Figure 7:
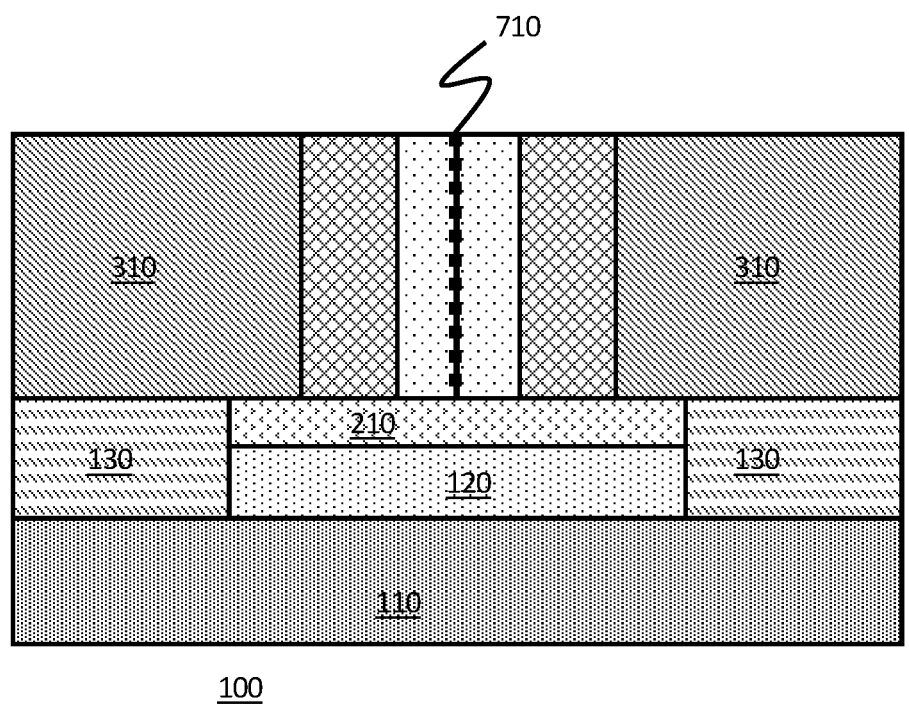
FIG. 7 provides a cross-sectional view of a step in the fabrication of a semiconductor device, according to an embodiment of the invention. The figure illustrates after the formation of a filament element.

FIG. 7 illustrates device 100 following formation of heater filament 710 along the seam of third dielectric spacer material 510. In an embodiment, the heater filament 710 is formed by heating the material, such as Cu or Ag, of heater element reservoir 210, causing material to diffuse upward along the seam. In an embodiment lacking a heater element reservoir material as part of the bottom electrode, the heater filament is formed through the deposition of a heater element reservoir material above the seam and subsequently heating this material causing it to diffuse downward along the seam to the upper surface of the bottom electrode. In some embodiments, the reservoir annealing and accompanying formation of the heater filament can be performed in later processing, after the formation of a PCM layer above the seam, or after formation of a PCM layer, optional barrier layer, and a top electrode above the seam.

Figure 8:
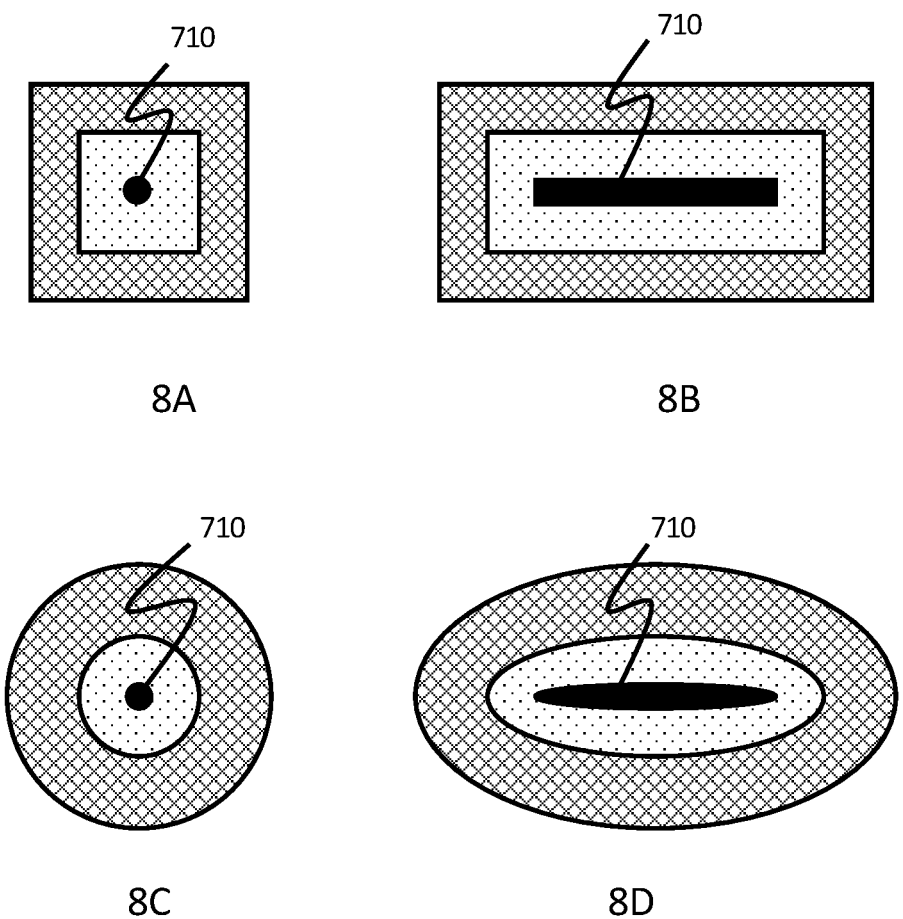
FIG. 8 provides a cross-sectional plan view of a step in the fabrication of a semiconductor device, according to an embodiment of the invention. The figure illustrates plan views of various embodiments of the invention.

FIG. 8 illustrates various embodiments of device 100 having different heater filament via and filament shapes. As shown in view 8A, the via has a square cross section and the filament 710 constitutes a point seam at the center of the cross section. View 8B illustrates a rectangular via and a filament 710 constituting a linear seam at the center of the rectangle. Similarly, view 8C illustrates a circular via having a point seam filament 710. FIG. 8D illustrates an elliptical via having a linear seam and filament 710 at its center.

Figure 9:
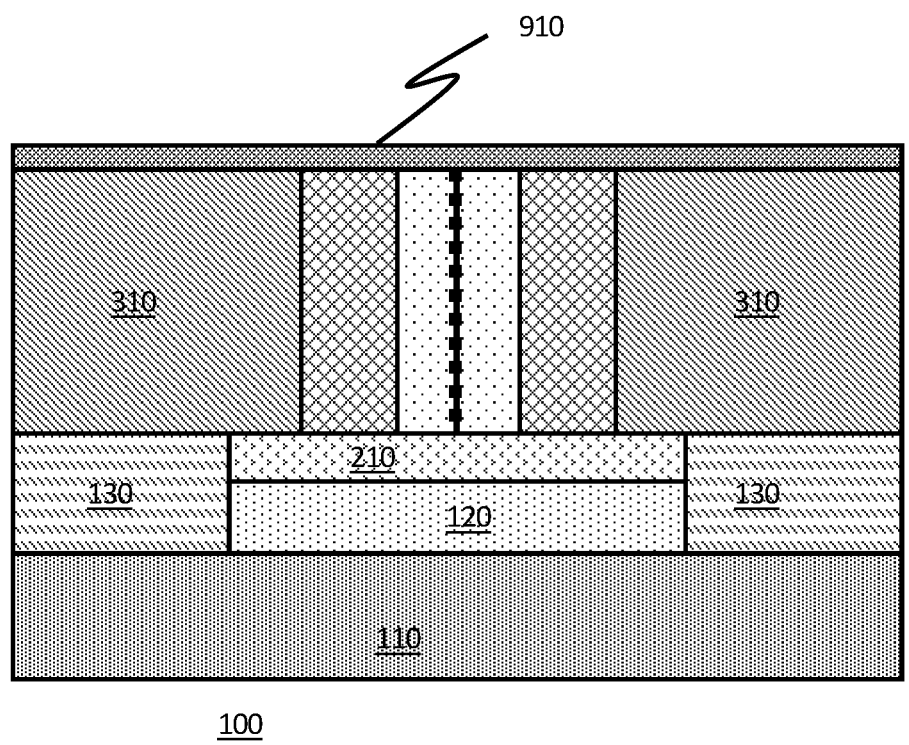
FIG. 9 provides a cross-sectional view of a step in the fabrication of a semiconductor device, according to an embodiment of the invention. The figure illustrates the device after deposition of an optional barrier layer.

FIG. 9 illustrates device 100 following fabrication of an optional upper barrier layer 910. As shown in the Figure, barrier layer 910 is deposited above the filament 710 and dielectric spacers 310, 410, and 510. A barrier layer 910 material, such as tantalum nitride (TaN), prevents diffusion of filament 710 materials, such as Cu or Ag, into the phase change material layer. Preventing this diffusion stabilizes the physical and electrical properties of the heater filaments 710, and prevents changes in the filaments and accompanying changes in the resistivity of the devices providing more consistency across arrays of PCM cells.

Figure 10:
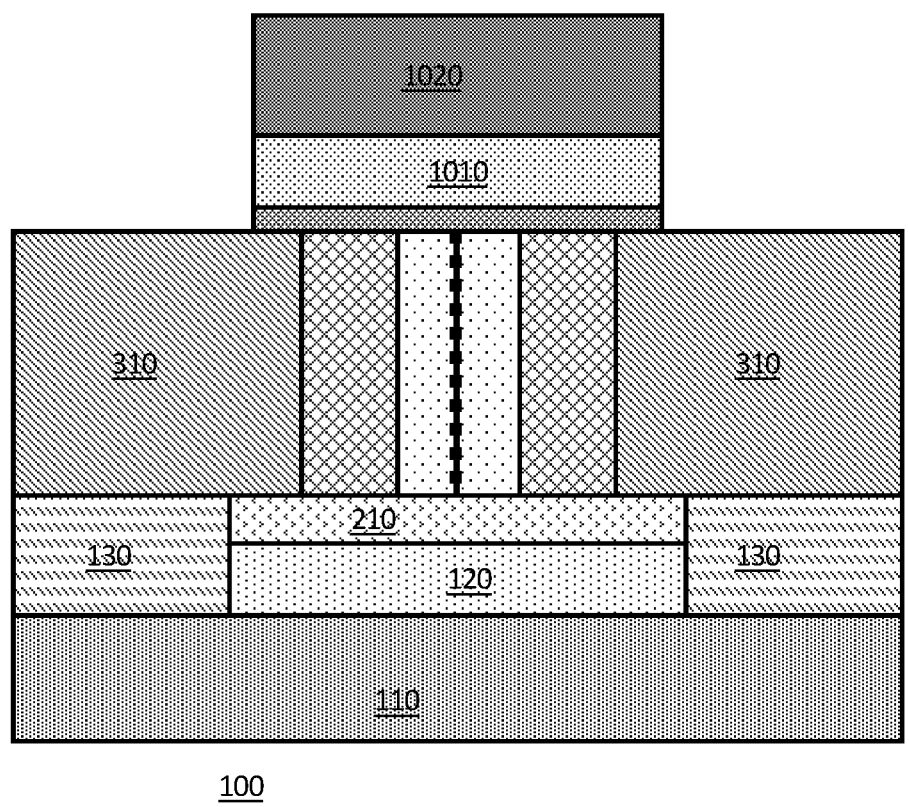
FIG. 10 provides a cross-sectional view of a step in the fabrication of a semiconductor device, according to an embodiment of the invention. The figure illustrates the device after formation of a PCM layer and top electrode.

FIG. 10 illustrates device 100 following the deposition, masking, patterning, and selective removal of a PCM layer and an upper, or top, electrode. In an embodiment, the PCM layer 1010, constitutes a crystalline alloy structure such as germanium antimony tellurium, or similar PCM materials. In an embodiment, the upper electrode 1020, constitutes a material such as titanium nitride (TiN), tungsten nitride (WN), titanium tungsten alloy (TiW), tungsten carbide (WC), or similar. Formation of this upper structure includes selective removal of portions of the upper barrier layer 910 to yield a uniform cross-section of each of the barrier layer 910, PCM layer 1010, and upper electrode layer 1020. In this embodiment, additional steps such as encapsulating the upper layers with an interlayer dielectric material and CMP of the combination of ILD material and upper electrode surfaces, completes this phase of the overall device fabrication.

The phase change material can include a Ge—Sb—Te (germanium-antimony-tellurium or "GST") alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc.

Figure 11:
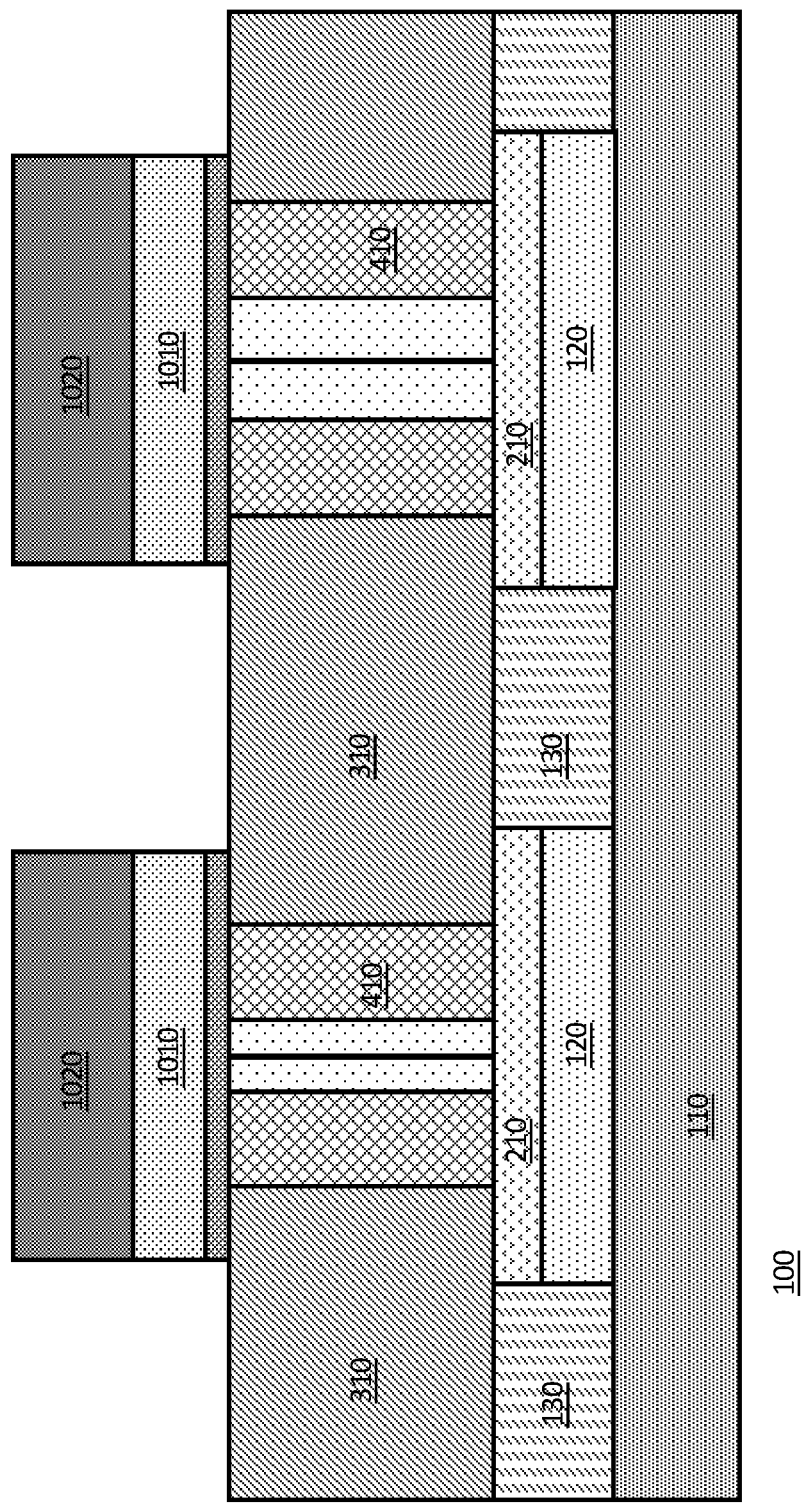
FIG. 11 provides a cross-sectional view of a step in the fabrication of a semiconductor device, according to an embodiment of the invention. The figure illustrates a pair of PCM devices having differing via sizes.

FIG. 11 provides an illustration of an advantage of the current devices and methods of fabrication. As shown in the Figure, third dielectric spacers 510 have different lateral dimensions arising from process variabilities. Despite such variations in dielectric spacer 510 dimensions, formation of heater filaments 710, along third dielectric spacer 510 seams, yields uniform heater elements and more uniform PCM cell performance. ALD of third dielectric spacer 510 proceeds until all inner vias are pinched off by the material.

Figure 12:
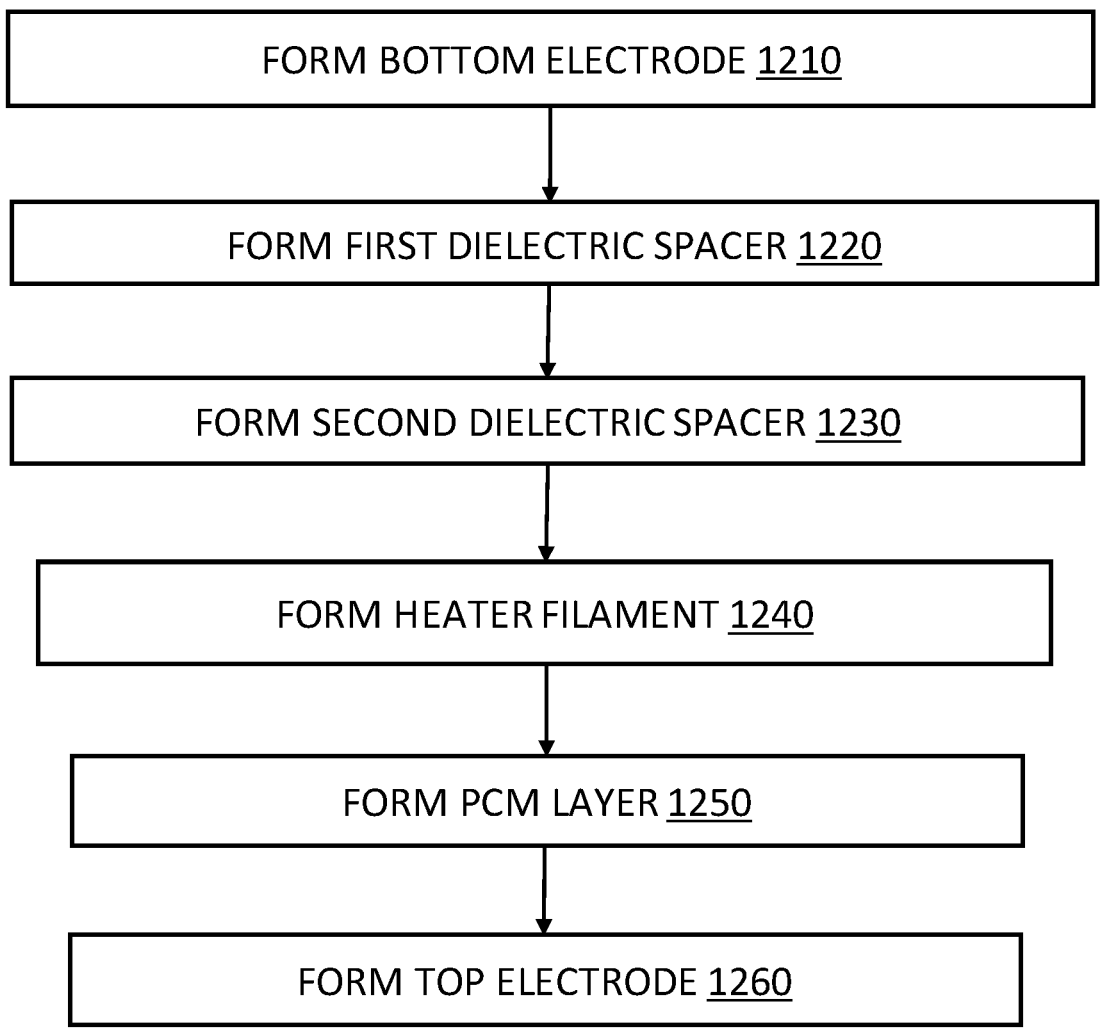
FIG. 12 provides a flowchart depicting a fabrication sequence, according to an embodiment of the invention.

Flowchart 1200, of FIG. 12 lists operational steps in the formation of disclosed structures. At block 1210, formation of a bottom electrode upon an underlying substrate occurs. The fabrication method includes deposition of a dielectric layer upon the substrate, selective etching of bottom electrode vias in the dielectric layer, and deposition of the bottom electrode material in the via. In an embodiment, the bottom electrode constitutes a single layer of material, such as tungsten. In an embodiment, the bottom electrode constitutes a bottom layer of a material such as tungsten followed by deposition of an upper layer comprising a material such as copper or silver, which further serves as a material reservoir for the diffusion of the heater filament itself.

At block 1220, the method forms a first dielectric spacer above the bottom electrode. The method disposes a layer of a first dielectric material above the bottom electrode and etches heater element vias through the dielectric layer, exposing portions of the bottom electrode. In an embodiment, an optional protective hardmask may be formed above the dielectric layer and the via etched through each of the hardmask and dielectric layers.

At block 1230, the method disposes a second dielectric material within the heater element via. The method deposits this material until the via is pinched off with a seam between portions of the second dielectric material growing from the sides of the via. The deposition of this material proceeds only from the dielectric material along the vertical sides of the via and does not form from the conductive surface of the bottom electrode. In an embodiment, the filling of the via proceeds in stages, deposition of a second dielectric material fills a portion of the via, for example, reduces the via from a nominal diameter of 40 nm, to a nominal diameter of about 15 nm. Deposition of a third dielectric material follows that of the second until filling of the via completes with the formation of the dielectric material seam as the final dielectric material pinches off the via. As deposition proceeds only from the sides of the via, the seam formed in the dielectric material provides a path from the upper surface of the dielectric material to the upper surface of the bottom electrode. In an embodiment, a precleaning of the bottom electrode surface prior to dielectric material deposition may be needed to remove any oxide formed there to prevent dielectric material growth from the upper surface of the bottom electrode during deposition of the material.

At block 1240, the method forms the heater filament in the seam of the dielectric material. In an embodiment, the method anneals the heater reservoir material at the upper surface of the bottom electrode, the leads to diffusion of atoms of the material from the reservoir upward along the seam to the upper surface of the dielectric material. In an embodiment, the method proceeds by depositing a heater filament material above the dielectric spacers and in contact with the seam. This material is then annealed and atoms diffuse downward along the seam making contact with the upper surface of the bottom electrode, forming a conductive filament between the bottom electrode and the upper PCM layers.

At block 1250, the method forms a crystalline layer of PCM material above the heater filament. The PCM material may be formed directly in contact with the heater filament, or the PCM material may be formed in contact with a barrier layer formed in contact with the heater filament. In an embodiment, formation of the barrier layer prevents the heater filament material, diffused into the dielectric material seam, from further diffusing into the PCM material layer. This prevents drift in the resistance of the PCM memory cell as the resistivity of the filament and the overall cell remain unchanged over time and use. The crystalline PCM layer constitutes the initial state of the layer. In use portions of the layer will transition back and forth between crystalline and amorphous as write signal s are applied to the layer using the heater filament. Reducing the heater element to a diffused series of elemental copper or silver atoms along the dielectric seam reduces the currents, and associated temperatures, necessary to write and reset the transitioning portions of the PCM cells.

At block 1260, the method forms the top electrode in contact with the upper surface of the PCM layer. In an embodiment, Layers of PCM material and top electrode material are deposited in order upon the filament and dielectric spacers, or alternatively, upon the barrier layer adjacent to the filament and dielectric spacers. The top electrode layer, PCM material layer, and optionally the barrier layer, are then masked, patterned, and selectively etched leaving the individual PCM cells, each such cell above an individual heater filament. After formation such cells may be encapsulated using an interlayer dielectric material, completing this phase of device fabrication.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A phase change memory (PCM) structure comprising:
a bottom electrode;
a first dielectric spacer disposed above and in contact with the bottom electrode, the first dielectric spacer comprising a vertical seam;
a second dielectric spacer disposed surrounding the first dielectric spacer and between the bottom electrode and the PCM layer;
a third dielectric spacer disposed between the bottom electrode and the PCM layer, the third dielectric spacer surrounding the second dielectric spacer;
a PCM layer disposed above the first dielectric spacer; and
a heater element disposed in the seam and in contact with the bottom electrode.

2. The PCM structure according to claim 1, further comprising:
a barrier layer disposed between the heater element and the PCM layer.

3. The PCM structure according to claim 1, the bottom electrode further comprising a filament reservoir in contact with the vertical seam.

4. The PCM structure according to claim 1, further comprising a top electrode in contact with the PCM layer.

5. The PCM structure according to claim 1, further comprising a heater element reservoir layer disposed above the first dielectric spacer and in contact with the seam.

6. A phase change memory (PCM) structure comprising:
a bottom electrode disposed upon a substrate, the bottom electrode comprising a filament reservoir;

a first dielectric spacer disposed above the filament reservoir, the first dielectric spacer comprising a vertical seam in contact with the filament reservoir;

a second dielectric spacer disposed surrounding the first dielectric spacer and between the bottom electrode and the PCM layer;

a third dielectric spacer disposed between the bottom electrode and the PCM layer, the third dielectric spacer surrounding the second dielectric spacer;

a filament disposed in the seam; and a PCM layer disposed above the filament.

7. The PCM structure according to claim 6, further comprising a barrier layer disposed between the first dielectric spacer and the PCM layer, wherein the barrier layer is in electrical contact with the filament.

8. The PCM structure according to claim 6, further comprising a top electrode disposed above the PCM layer.

9. The PCM structure according to claim 6, wherein the PCM layer comprises a germanium-antimony-tellurium alloy.

\* \* \* \* \*